United States Patent [19]
Okawa

[11] Patent Number: 5,479,005
[45] Date of Patent: Dec. 26, 1995

[54] LOW-POWER CONSUMPTION BI-CMOS CIRCUIT FORMED BY A SMALL NUMBER OF CIRCUIT COMPONENTS

[75] Inventor: Shin-Ichi Okawa, Tokyo, Japan

[73] Assignee: NEC Corporation, Tokyo, Japan

[21] Appl. No.: 243,138

[22] Filed: May 16, 1994

[30] Foreign Application Priority Data

May 21, 1993 [JP] Japan ................................. 5-141169

[51] Int. Cl.$^6$ .................................................. H03K 19/20
[52] U.S. Cl. .............................. 326/110; 326/26; 326/84
[58] Field of Search .................................. 307/446, 443, 307/455; 326/110, 126, 31, 66, 84, 26

[56] References Cited

U.S. PATENT DOCUMENTS

| | | | |
|---|---|---|---|
| 4,868,421 | 9/1989 | Herndon et al. | 307/446 |
| 4,937,480 | 6/1990 | Higuchi et al. | 307/570 |
| 4,992,681 | 2/1991 | Urakawa et al. | |
| 5,075,579 | 12/1991 | Ueno | 307/475 |
| 5,124,581 | 6/1992 | Umeki | 307/446 |
| 5,331,225 | 7/1994 | Matsui et al. | 307/446 |

FOREIGN PATENT DOCUMENTS

| | | |
|---|---|---|
| 0305000 | 3/1989 | European Pat. Off. . |
| 0417786 | 3/1991 | European Pat. Off. . |
| 0451365 | 10/1991 | European Pat. Off. . |
| 0501085 | 9/1992 | European Pat. Off. . |
| 5-075423 | 3/1993 | Japan . |
| 2266420 | 10/1993 | United Kingdom . |
| WO91/18448 | 11/1991 | WIPO . |

OTHER PUBLICATIONS

By S. Embabi et al., "Analysis and Optimization of BiCMOS Digital Circuit Structures", IEEE Journal of Solid-State Circuits, Apr. 1991, vol. 26, No. 4, pp. 676–679.

*Primary Examiner*—Edward P. Westin
*Assistant Examiner*—Stephen Calogero
*Attorney, Agent, or Firm*—Young & Thompson

[57] ABSTRACT

A bi-CMOS circuit has an emitter-coupled logic circuit responsive to an input signal for producing a logic signal and the complementary logic signal, an emitter follower responsive to the logic signal for changing the voltage level at the emitter node thereof and a switching circuit coupled between the emitter follower and a negative power voltage line and responsive to the complementary logic signal for selectively coupling the emitter node and the negative power voltage line with an output node of the bi-CMOS circuit so that through-current does not flow through the switching circuit.

6 Claims, 6 Drawing Sheets

LOW-POWER CONSUMPTION BI-CMOS CIRCUIT FORMED BY A SMALL NUMBER OF CIRCUIT COMPONENTS

FIELD OF THE INVENTION

This invention relates to a logic circuit and, more particularly, to a logic circuit implemented by a combination of bipolar transistors and a complementary inverter (which is hereinbelow referred to as "bi-CMOS circuit").

DESCRIPTION OF THE RELATED ART

A typical example of the bi-CMOS circuit is disclosed in Japanese Patent Publication of Unexamined Application (Kokai) No. 59-263918, and is illustrated in FIG. 1 of the drawings. The prior art bi-CMOS circuit largely comprises an emitter coupled logic circuit 1 for inverting an input signal Vin and a level-shift circuit 2 for producing an output signal Vout.

The emitter coupled logic circuit 1 comprises a differential section 1a responsive to an input signal Vin for producing a high-impedance signal X and the high-impedance complementary signal CX and a buffer section 1b for producing a low-impedance signal Y and the low-impedance complementary signal CY, and the level-shift circuit 2 is responsive to the low-impedance signal Y and the low-impedance complementary signal CY for producing the output logic signal Vout.

The differential section 1a comprises a series combination of a resistor R1 and a bipolar transistor Q1 coupled between a ground voltage line and a common node N1, a series combination of a resistor R2 and a bipolar transistor Q2 also coupled between the ground voltage line and the common node N1 and a series combination of a bipolar transistor Q3 and a resistor R3 coupled between the common node N1 and a first negative voltage line Vee1. The input signal Vin is supplied to the base node of the bipolar transistor Q1, and the bipolar transistor Q2 is biased with a reference voltage signal Vr. The bipolar transistor Q3 is appropriately biased with a negative bias voltage Vb so that the bipolar transistor Q3 and the resistor R3 serve as a constant current source.

The bipolar transistor Q1 turns on and off depending upon the voltage level of the input signal Vin, and the constant current source, i.e., the series of bipolar transistor Q3 and the resistor R3 causes the bipolar transistor Q2 to complementarily turn off and on. For this reason, the voltage levels at the collector nodes C1 and C2 are varied with the input signal Vin, and the high-impedance signal X and the high-impedance complementary signal CX are produced from the input signal Vin.

The buffer section 1b comprises a series combination of bipolar transistors Q4 and Q5 and a resistor R4 coupled between the ground voltage line and the first negative voltage line Vee1 and a series combination of bipolar transistors Q6 and Q7 and a resistor R5 coupled between the ground voltage line and the first negative voltage line vee1. The negative bias voltage Vb is supplied to the base nodes of the bipolar transistors Q5 and Q7, and the bipolar transistors Q5 and Q7 and the resistors R4 and R5 serve as constant current sources.

The high-impedance signal X and the high-impedance complementary signal CX are respectively supplied to the base nodes of the bipolar transistors Q4 and Q6, and the bipolar transistors Q4 and Q6 produce the low-impedance signal Y and the low-impedance signal CY from the high-impedance signal X and the high-impedance signal CX, respectively.

The level-shift circuit 2 comprises a series combination of a p-channel enhancement type switching transistor Qp1 and an n-channel enhancement type load transistor Qn1 coupled between the ground voltage line and a second negative voltage line Vee2 and a series combination of a p-channel enhancement type switching transistor Qp2 and an n-channel enhancement type load transistor Qn2 also coupled between the ground voltage line and the second negative voltage line Vee2. The p-channel enhancement type switching transistors Qp1 and Qp2 complementarily turn on and off in response to the low-impedance signal Y and the low-impedance complementary signal CY, and the voltage level at the common drain node N2 changes the channel resistances of the n-channel enhancement type load transistors Qn1 and Qn2 for producing the output signal Vout at the other common drain node N3.

FIG. 2 illustrates the circuit behavior of the emitter coupled logic circuit 1, and FIG. 3 illustrates the input-to-output voltage characteristics of the prior art bi-CMOS circuit.

If the input signal Vin increases the voltage level across the reference voltage Vr, the bipolar transistor Q1 turns on, and the current passing therethrough is increased. The voltage level at the common node N1 is increased, and the bipolar transistor Q2 turns off. As a result, the high-impedance signal X goes up to the ground voltage level, and the high-impedance complementary signal CX goes down (see FIG. 2).

The bipolar transistors Q4 and Q6 turn off and on, and lower the low-impedance signal Y and the low-impedance complementary signal CY by the emitter-base forward voltage Veb.

The low-impedance signal Y and the low-impedance complementary signal CY cause the p-channel enhancement type switching transistors Qp1 and Qp2 to turn off and on, and the n-channel enhancement type load transistors Qn1 and Qn2 turn off. As a result, the common drain node N3 increases the voltage level, and the output signal Vout is lifted to the ground voltage level (see FIG. 3). In this instance, the input signal Vin between −0.9 volt and −1.7 volts is changed to the output signal Vout between 0 and −5 volts.

The prior art bi-CMOS circuit encounters a problem in a large number of circuit components. The differential section 1a needs the three bipolar transistors and the three resistors, the buffer section 1b needs the four bipolar transistors and the two resistors, and the level-shift circuit 2 needs the four field effect transistors.

Another problem inherent in the prior art bi-CMOS circuit is a large amount of current consumption. This is because of the fact that the p-channel enhancement type switching transistor Qp1 and the n-channel enhancement type load transistor Qn1 are turned on while the level-shift circuit 2 is keeping the output signal Vout at the negative low voltage level. In other words, through-current flows through the p-channel enhancement type switching transistor Qp1 and the n-channel enhancement type load transistor Qn1, and increases the current consumption.

SUMMARY OF THE INVENTION

It is therefore an important object of the present invention provide a low-power consumption bi-CMOS circuit which is implemented by a small number of circuit components.

To accomplish the object, the present invention proposes to couple an emitter follower in series with a switching circuit implemented by field effect transistors.

In accordance with the present invention, there is provided a bi-CMOS circuit comprising: a) a bipolar circuit coupled between a first power voltage line and a second power voltage line, and responsive to an input signal for producing an intermediate signal and a complementary intermediate signal; and b) a level-shift circuit responsive to the intermediate signal and the complementary intermediate signal for producing an output signal at an output node of the bi-CMOS circuit, and having b-1) a first emitter follower having a collector node coupled with the first power voltage line, and responsive to the intermediate signal for changing a voltage level at the emitter node thereof, and b-2) a first switching circuit implemented by field effect transistors coupled between the emitter node of the first emitter follower and a third power voltage line, and responsive to the complementary intermediate signal for selectively coupling the output node with the emitter node and the third power voltage line.

BRIEF DESCRIPTION OF THE DRAWINGS

The feature and advantages of the bi-CMOS circuit according to the present invention will be more clearly understood from the following description taken in conjunction with the accompanying drawings in which.

DESCRIPTION OF THE PREFERRED EMBODIMENTS

First Embodiment

Figure 1:
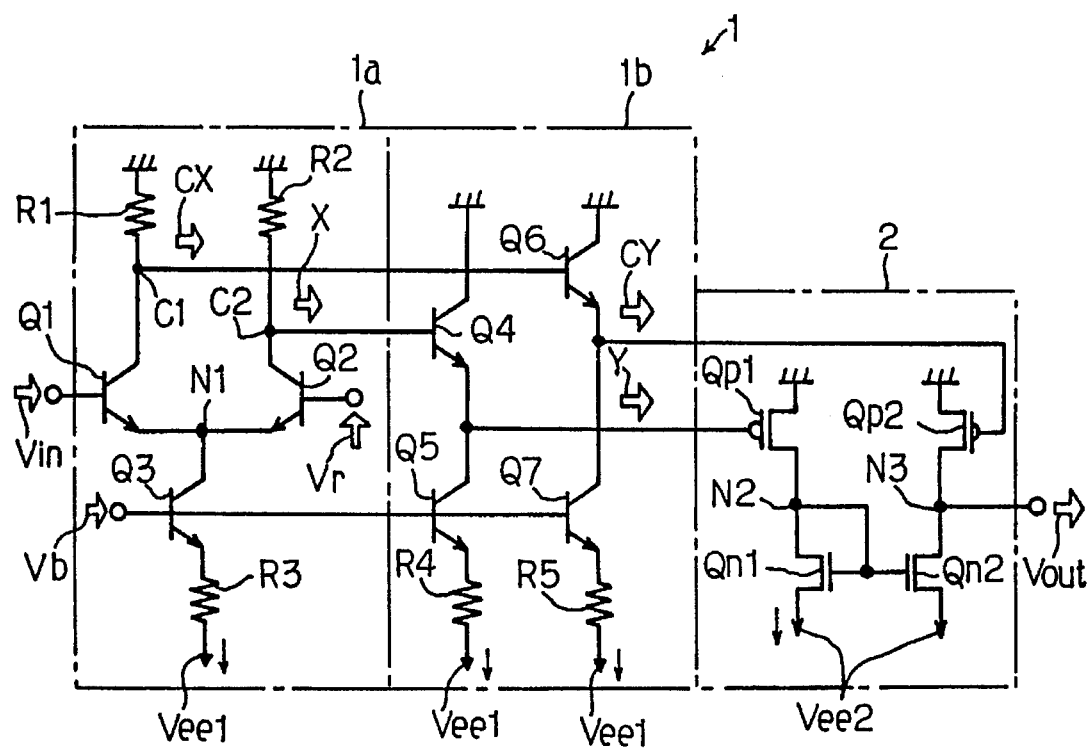
FIG. 1 is a circuit diagram showing the arrangement of the prior art bi-CMOS circuit.
Figure 2:
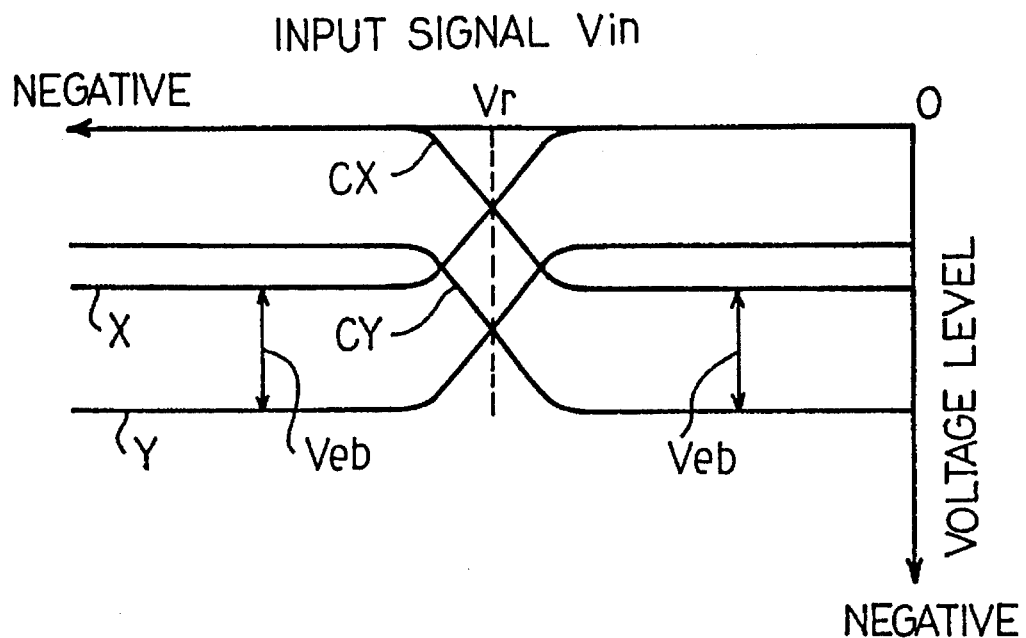
FIG. 2 is a diagram showing the circuit behavior of the emitter coupled logic circuit incorporated in the prior art bi-CMOS circuit.
Figure 3:
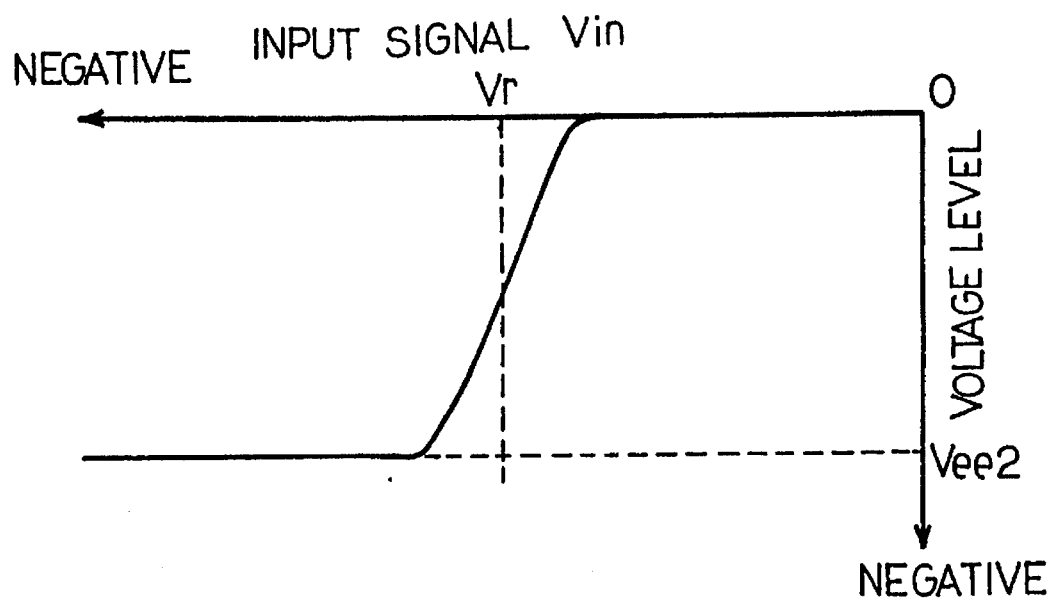
FIG. 3 is a diagram showing the circuit behavior of the prior art bi-CMOS circuit.
Figure 4:
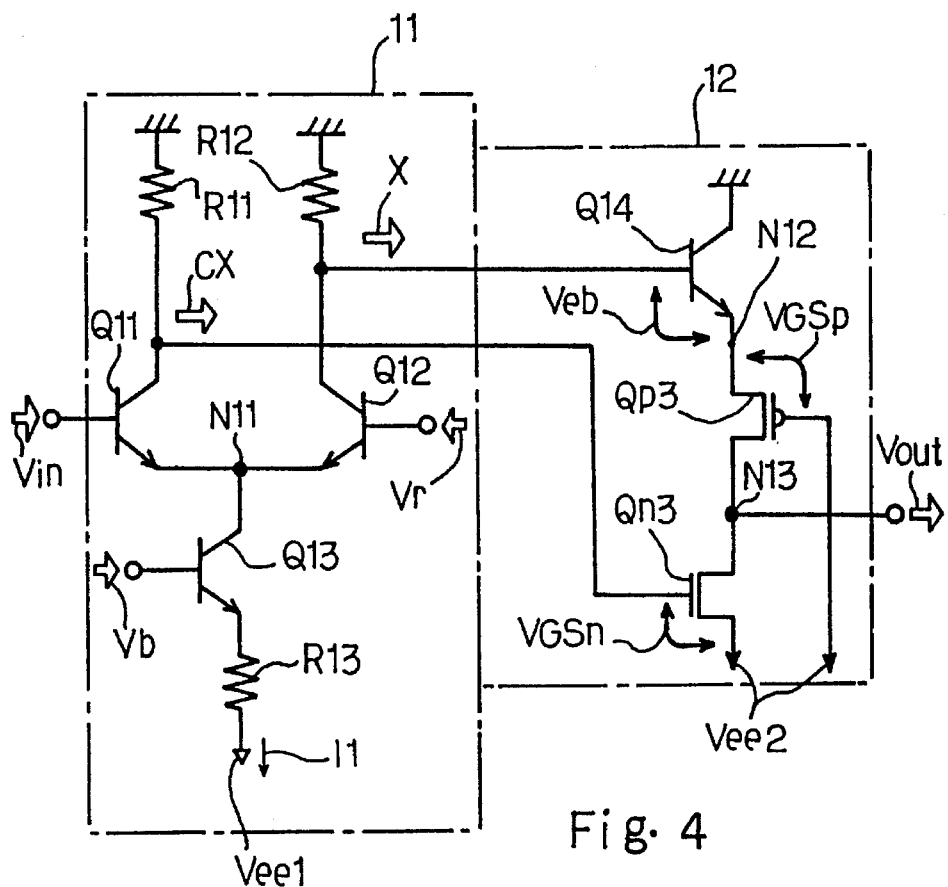
FIG. 4 is a circuit diagram showing the arrangement of a bi-CMOS circuit according to the present invention.

Referring to FIG. 4 of the drawings, a bi-CMOS circuit embodying the present invention largely comprises a differential amplifier circuit 11 responsive to an input signal Vin for producing a logic signal X and a complementary logic signal CX and a level-shift circuit 12 for producing an output signal Vout from the logic signal X and the complementary logic signal CX. In the following description, a high voltage means a voltage level closer to the ground voltage level than a low voltage level, and the high voltage level and the low voltage level are assumed to be corresponding to logic "1" and logic "0" respectively.

The differential amplifier circuit 11 serves as a bipolar circuit, and the logic signal X and the complementary logic signal CX serve as an intermediate signal and a complementary intermediate signal. The differential amplifier circuit 11 comprises a series combination of a resistor R11 and a bipolar transistor Q11 coupled between a ground voltage line and a common node N11, a series combination of a resistor R12 and a bipolar transistor Q12 also coupled between the ground voltage line and the common node N11 and a series combination of a bipolar transistor Q13 and a resistor R13 coupled between the common node N11 and a first negative voltage line Vee1. The input signal Vin is supplied to the base node of the bipolar transistor Q11, and a constant reference voltage signal Vr is supplied to the base node of the bipolar transistor Q12. A negative bias voltage Vb is supplied to the base node of the bipolar transistor Q13, and the bipolar transistor Q13 and the resistor R13 as a whole constitute a constant current source. The input signal Vin changes the voltage level thereof across the constant reference voltage signal Vr, and the logic signal X and the complementary logic signal CX complementarily change the respective voltage levels between a negative low voltage level and the ground voltage level.

The level-shift circuit 12 comprises a series combination of a bipolar transistor Q14, a p-channel enhancement type switching transistor Qp3 and an n-channel enhancement type switching transistor Qn3 coupled between the ground voltage line and a second negative voltage line Vee2, and the second negative voltage line Vee2 supplies the second negative power voltage Vee2 different from the negative voltage level at the common node N11. The bipolar transistor Q14 serves as an emitter follower, and the p-channel enhancement type switching transistor Qp3 and the n-channel enhancement type switching transistor Qn3 form in combination a switching circuit.

Figure 5:
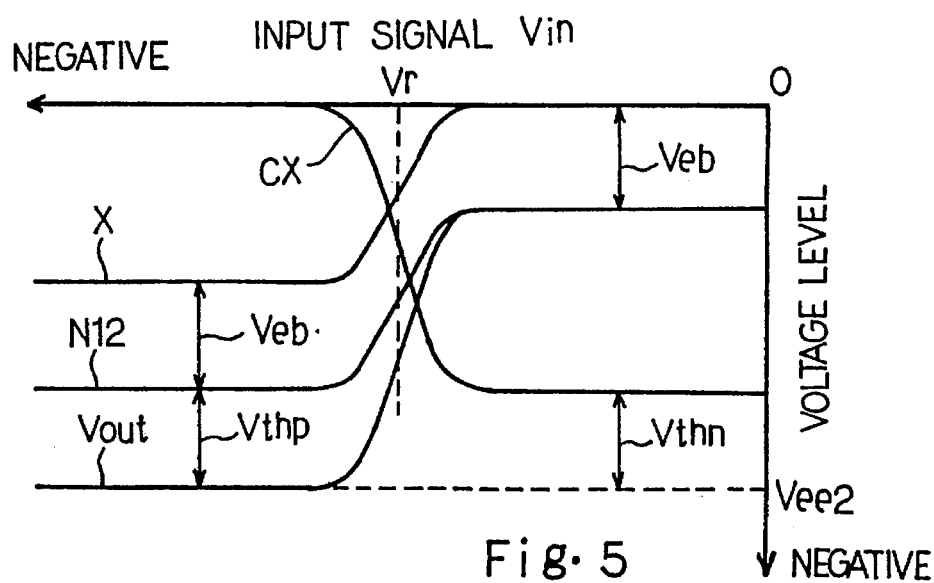
FIG. 5 is a diagram showing the circuit behavior of the bi-CMOS circuit shown in FIG. 4.

The logic signal X is supplied to the base node of the bipolar transistor Q14, and the complementary logic signal CX is supplied to the gate electrode of the n-channel enhancement type switching transistor Qn3. The logic signal X and the complementary logic signal CX cause the bipolar transistor Q14 and the n-channel enhancement type switching transistor Qn3 to complementarily turn on and off, and the output signal Vout takes place at the common drain node between the p-channel enhancement type switching transistor Qp3 and the n-channel enhancement type switching transistor Qn3. The bipolar transistor Q14, the p-channel enhancement type switching transistor Qp3 and the n-channel enhancement type switching transistor Qn3 introduce respective potential drops, and the logic signal X, the complementary logic signal CX, the voltage level at the emitter node of the bipolar transistor Q14 and the output signal Vout are shown in FIG. 5 in terms of the input signal Vin. Veb, Vthp and Vthn are indicative of the emitter-base forward bias voltage of the bipolar transistor Q14, the threshold level of the p-channel enhancement type switching transistor Qp3 and the threshold level of the n-channel enhancement type switching transistor Qn3, respectively.

In detail, the input signal Vin is assumed to be higher than or closer to the ground voltage level rather than the constant reference voltage signal Vr. The bipolar transistor Q11 is turned on, and constant current I1 flows through the bipolar transistor Q11. As a result, the voltage level at the common node N11 is increased, and the bipolar transistor Q12 turns off. The resistor R11 decreases the voltage level Vcx of the complementary logic signal CX as given by Equation 1.

$$Vcx = -I1 \times r11 \text{ (volt)} \qquad \text{Equation 1}$$

where r11 is the resistance of the resistor R11. On the other hand, the bipolar transistor Q12 allows the logic signal X to go up to the ground voltage level, and the voltage level of the logic signal X is hereinbelow labeled with Vx.

In this situation, the resistance r11 is regulated to an appropriate value so that the potential difference VGSn between the voltage level Vcx and the second negative power voltage level Vee2 does not exceed the threshold level Vthn of the n-channel enhancement type switching transistor Qn3. For this reason, the n-channel enhancement type switching transistor Qn3 turns off.

On the other hand, the logic signal X of the ground voltage level allows bipolar transistor Q14 to turn on, and the voltage level at the emitter node N12 is lower than the ground voltage level by the emitter-base forward voltage Vf of 0.7 volt. The second negative power voltage Vee2 is applied to the gate electrode of the p-channel enhancement type switching transistor Qp3, and the potential difference VGSp between the gate electrode and the emitter node N12 is given by Equation 2.

$$VGSp = Vee2 - (Vx - Vf) = Vee2 + 0.7 \qquad \text{Equation 2}$$

The threshold level Vthp allows the p-channel enhancement type switching transistor Qp3 to turn on under the second negative power voltage level Vee2, and the voltage level at the emitter node N12 is propagated to the common drain node N13 between the p-channel enhancement type switching transistor Qp3 and the n-channel enhancement type switching transistor Qn3. In summary, the bi-CMOS circuit is responsive to the input signal Vin of the high voltage level for producing the output signal Vout of 0.7 volt.

If the input signal Vin is lower than or farther from the ground voltage level than the constant reference voltage signal Vr, the bipolar transistor Q11 is turned off, and the current I1 flows through the bipolar transistor Q12. As a result, the logic signal X lowers the voltage level thereof than the ground voltage level, and the complementary logic signal CX is lifted to the ground voltage level. The second negative power voltage Vee2 is low enough to cause the n-channel enhancement type switching transistor Qn3 to turn on, and the common drain node N13 is electrically connected with the second negative power voltage line Vee2.

The voltage level Vx of the logic signal X is given by Equation 3.

$$Vx = -I1 \times r12 \text{ (volt)} \qquad \text{Equation 3}$$

where r12 is the resistance of the resistor R12. The bipolar transistor Q14 pulls down the voltage level at the emitter node N12, and the potential difference VGSp becomes smaller than the threshold level Vthp. As a result, the p-channel enhancement type switching transistor Qp3 turns off, and the output signal Vout becomes equal to the second negative power voltage level Vee2.

As will be appreciated from the foregoing description, the bi-CMOS circuit according to the present invention is implemented by a smaller number of circuit components than the prior art bi-CMOS circuit, and no through-current flows through the level-shift circuit 12.

Second Embodiment

Figure 6:
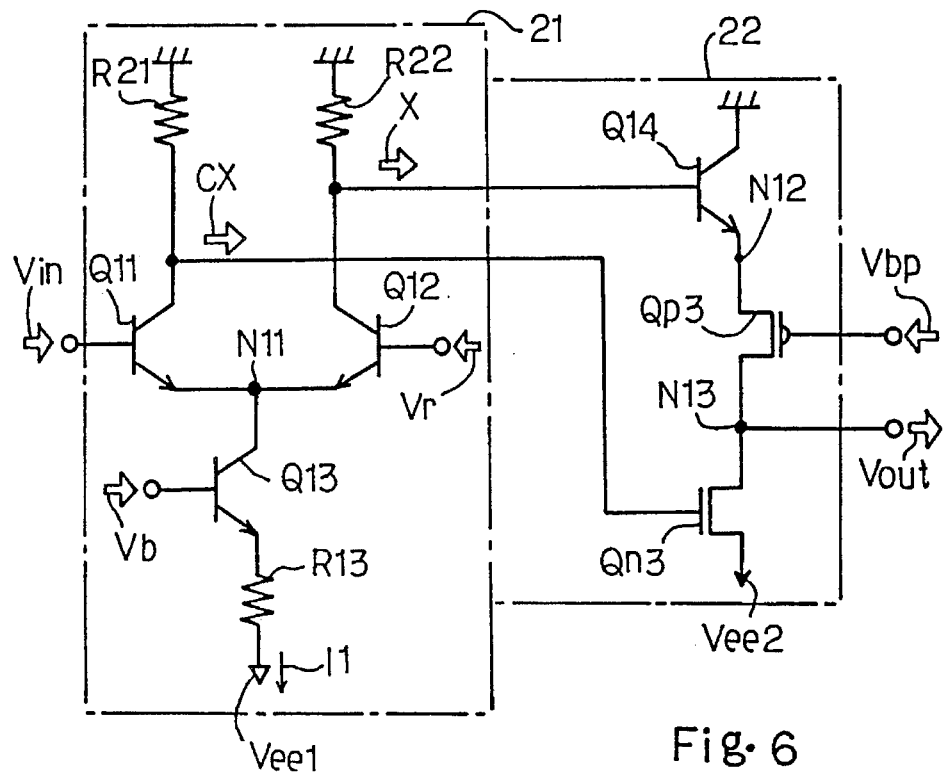
FIG. 6 is a circuit diagram showing the arrangement of another bi-CMOS circuit according to the present invention.

Turning to FIG. 6 of the drawings, a bi-CMOS circuit embodying the present invention largely comprises a differential amplifier circuit 21 and a level-shift circuit 22. The differential amplifier circuit 21 and the level-shift circuit 22 are similar in circuit arrangement to the differential amplifier circuit 11 and the level-shift circuit 12 except for resistors R21 and R22 and a gate bias voltage Vbp. For this reason, other circuit components of the second embodiment are labeled with the same references designating counter-parts of the first embodiment without detailed description.

The resistor R21 is equal in resistance to the resistor R22, and the p-channel enhancement type switching transistor Qp3 is gated with a constant negative gate bias voltage Vbp. The constant negative gate bias voltage Vbp is regulated in such a manner that the p-channel enhancement type switching transistor Qp3 turns off when the bipolar transistor Q12 lowers the logic signal x.

The bi-CMOS circuit implementing the second embodiment achieves all of the advantages of the first embodiment, and, moreover, the fabrication process is simpler than that of the first embodiment, because the resistor R21 is equal in dimensions and doping level to the resistor R22.

Third Embodiment

Figure 7:
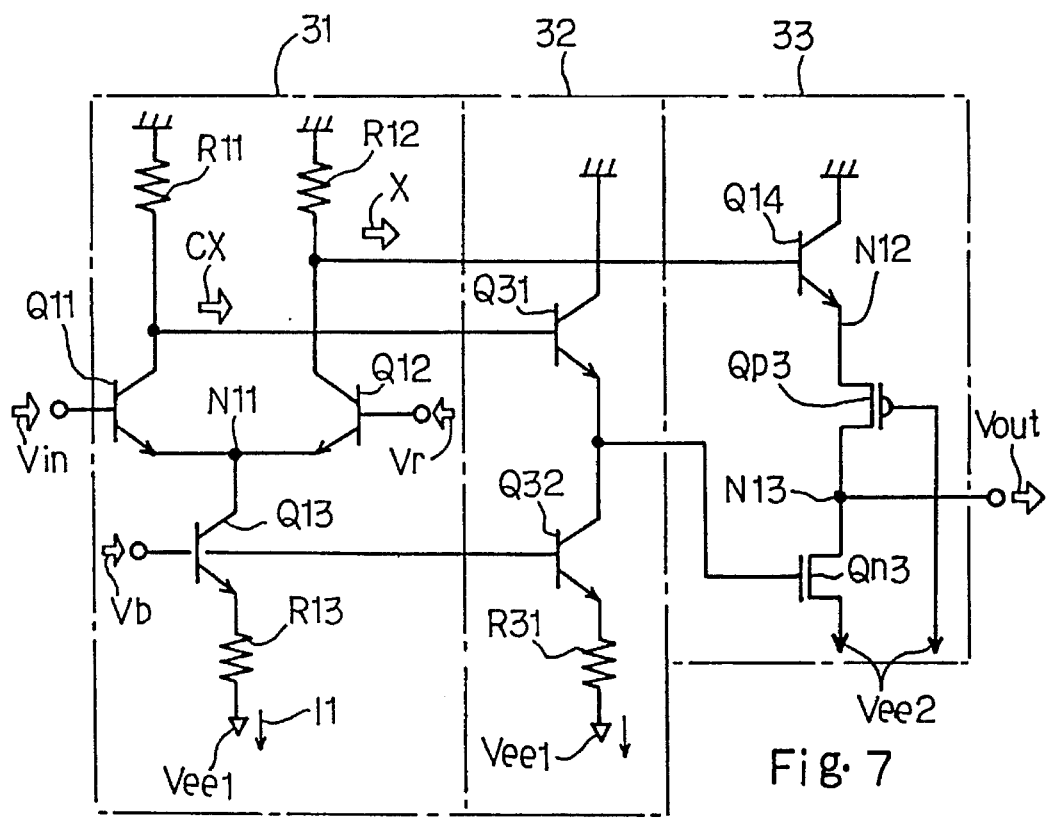
FIG. 7 is a circuit diagram showing the arrangement of yet another bi-CMOS circuit according to the present invention.

Turning to FIG. 7 of the drawings, yet another bi-CMOS circuit embodying the present invention largely comprises a differential amplifier circuit 31, a buffer circuit 32 and a level-shift circuit 33. The differential amplifier circuit 31 and the level-shift circuit 33 are similar in circuit arrangement to the differential amplifier circuit 11 and the level-shift circuit 12, and the circuit components are labeled with the same references designating the counter-parts of the first embodiment.

The buffer circuit 32 is implemented by a series combination of bipolar transistors Q31 and Q32 and a resistor R31 coupled between the ground voltage line and the negative power voltage line Vee1, and is inserted between the collector node of the bipolar transistor Q11 and the gate electrode of the n-channel enhancement type switching transistor Qn3 for decreasing the parasitic capacitance coupled with the resistor R11.

If the complementary logic signal CX is directly supplied to the gate electrode of the n-channel enhancement type switching transistor Qn3, a large amount of gate capacitance is coupled with the resistor R11, and the large time constant retards the propagation of the complementary logic signal CX. However, the buffer circuit 32 can rapidly charge and discharge the gate capacitance, and accelerates the switching action of the n-channel enhancement type switching transistor Qn3.

The buffer circuit 32 is used for the complementary logic signal CX only, and, for this reason, the total number of circuit components and the current consumption are smaller than those of the prior art bi-CMOS circuit.

Fourth Embodiment

Figure 8:
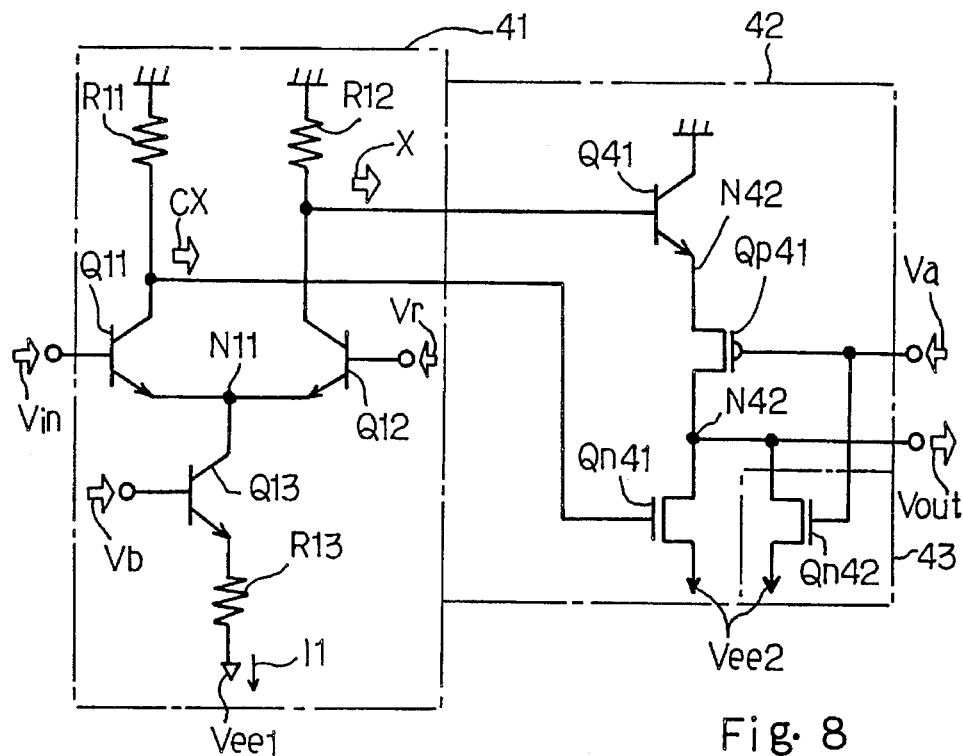
FIG. 8 is a circuit diagram showing the arrangement of yet another bi-CMOS circuit according to the present invention.

Turning to FIG. 8 of the drawings, a bi-CMOS circuit embodying the present invention largely comprises a differential amplifier circuit 41, a level-shift circuit 42 and an additional switching circuit 43, and the differential amplifier circuit 41 is similar in circuit arrangement to the differential amplifier circuit 11. The circuit components are labeled with the same references used in the first embodiment without detailed description for the sake of simplicity.

The level-shift circuit 42 comprises a series of a bipolar transistor Q41 coupled at the collector node with the ground voltage line, a p-channel enhancement type switching transistor Qp41 coupled between the bipolar transistor Q41 and an output node N41 and an n-channel enhancement type switching transistor Qn41 coupled between the output node N41 and the second negative power voltage line Vee2. logic The switching circuit 43 and the differential amplifier circuit 41 form in combination a logic circuit, and carry out the AND operation on the input signal Vin and another input signal Va.

The bipolar transistor Q41 changes the voltage level at the emitter node N42 thereof depending upon the logic signal X, and the input signal Va is supplied to the gate electrode of the p-channel enhancement type switching transistor Qp41 and the gate electrode of the n-channel enhancement type switching transistor Qn42. For this reason, the p-channel enhancement type switching transistor Qp41 and the n-channel enhancement type switching transistor Qn42 complementarily turn on and off depending upon the voltage level of the input signal Va.

While the input signal Va is equal to the second negative power voltage Vee2, the p-channel enhancement type switching transistor Qp41 turns on, and the n-channel enhancement type switching transistor Qn42 turns off. On the other hand, if the input signal Va is increased, the p-channel enhancement type switching transistor Qp41 turns off, and the n-channel enhancement type switching transistor Qn42 turns on. The bi-CMOS circuit implementing the fourth embodiment behaves as similar to the first embodiment, and achieves all of the advantages.

The input signal Va may serve as an enable signal or another input signal, and the logic circuit carries out the AND operation. Thus, only one additional switching transistor Qn42 allows the bi-CMOS circuit to carry out the AND operation.

Fifth Embodiment

Figure 9:
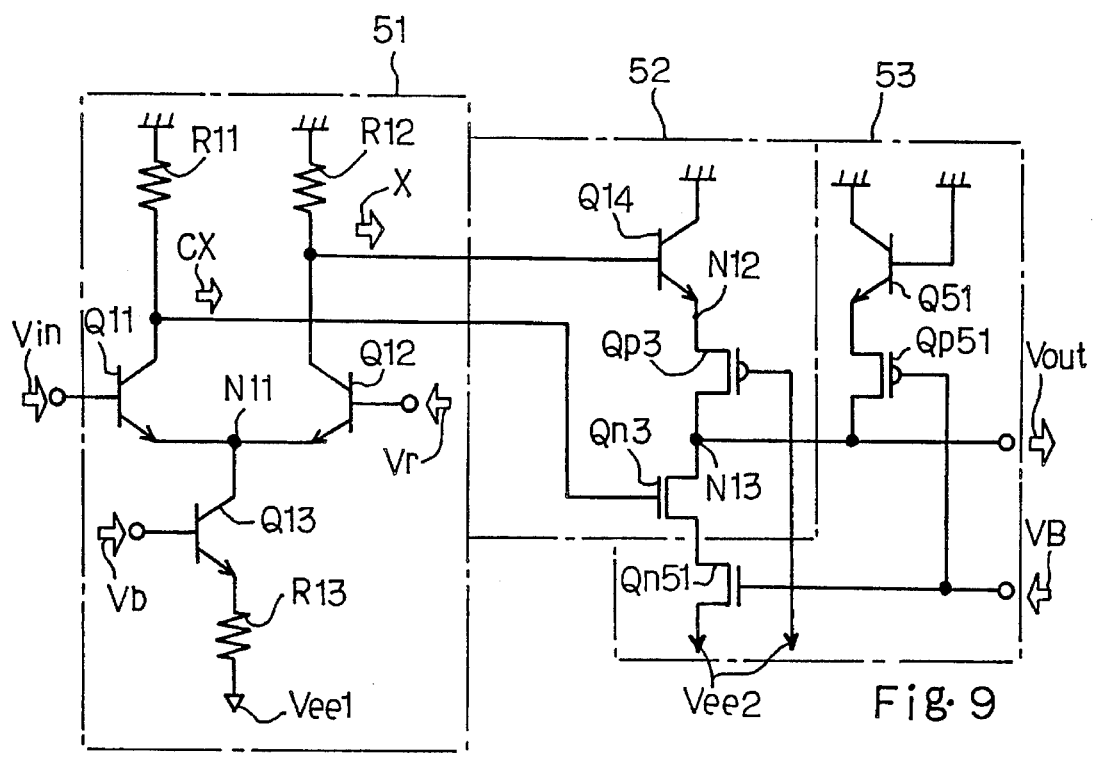
FIG. 9 is a circuit diagram showing the arrangement of yet another bi-CMOS circuit according to the present invention.

Turning to FIG. 9 of the drawings, yet another bi-CMOS circuit embodying the present invention largely comprises a differential amplifier circuit 51, a level-shift circuit 52 and an additional switching circuit 53. The differential amplifier circuit 51 and the level-shift circuit 52 are similar in circuit arrangement to those of the first embodiment, and circuit components thereof are labeled with the same references as those of the first embodiment without detailed description.

The additional switching circuit 53 comprises a bipolar transistor Q51 coupled at the collector node and the base node thereof with the ground voltage line, a p-channel enhancement type switching transistor Qp51 coupled between the emitter node of the bipolar transistor Q51 and the output node N13 and an n-channel enhancement type switching transistor Qn51 coupled between the n-channel enhancement type switching transistor Qn3 and the second negative power voltage line Vee2.

Another input signal VB is supplied to the gate electrode of the n-channel enhancement type switching transistor Qp51 and to the gate electrode of the n-channel enhancement type switching transistor Qn51, and the p-channel enhancement type switching transistor Qp51 and the n-channel enhancement type switching transistor Qn51 complementarily turn on and off for providing a current path between the output node N13 and one of the ground voltage line and the second negative power voltage line Vee2.

The differential amplifier circuit 51, the series combination of the p-channel enhancement type switching transistor Qp3 and the n-channel enhancement type switching transistor Qn3 and the switching circuit 53 form in combination a logic circuit operable on the input signals Vin and VB for the OR function.

Sixth Embodiment

Figure 10:
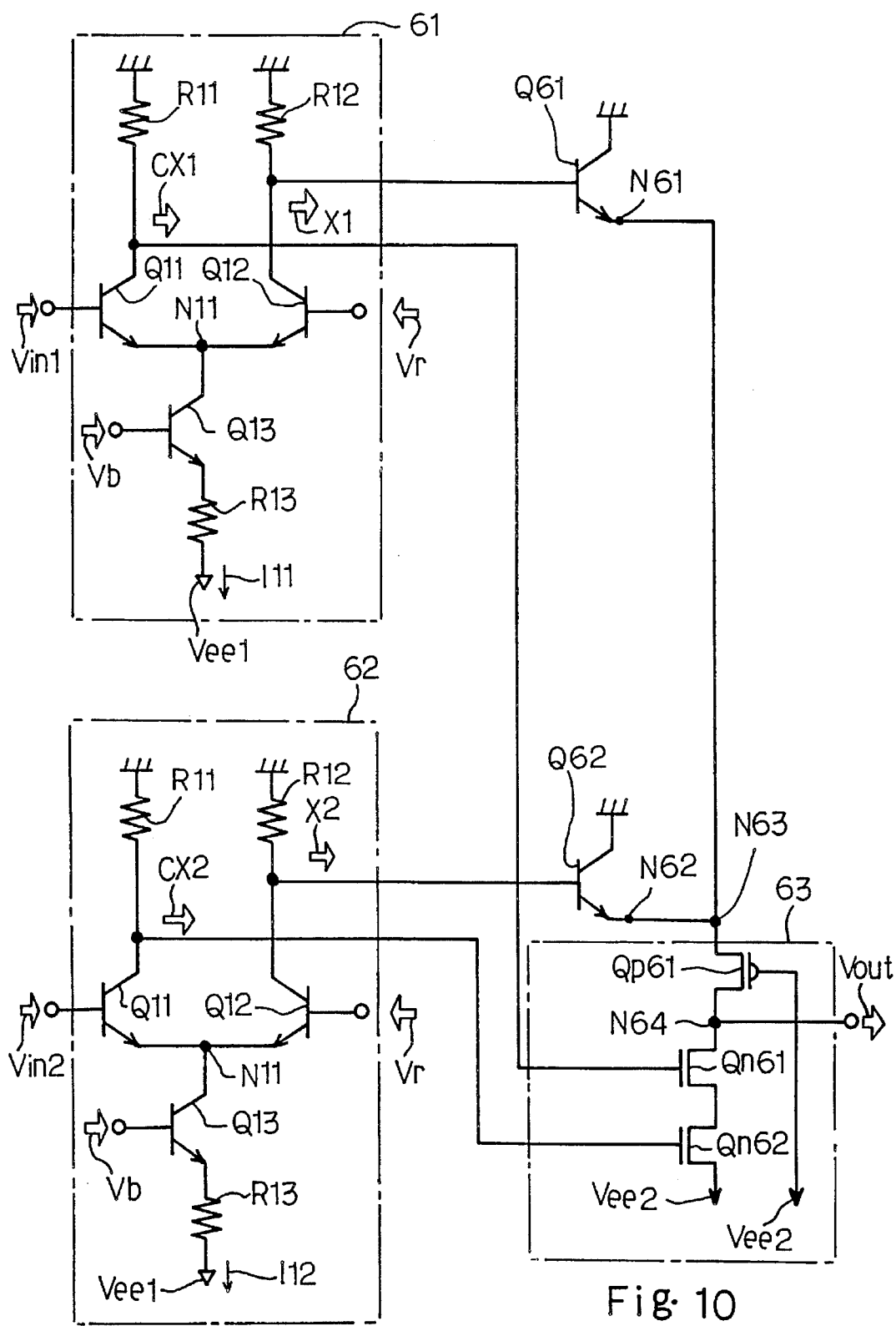
FIG. 10 is a circuit diagram showing the arrangement of yet another bi-CMOS circuit according to the present invention.

Turning to FIG. 10 of the drawings, yet another bi-CMOS circuit embodying the present invention largely comprises a first differential amplifier circuit 61 responsive to a first input signal Vin1 for producing a first logic signal X1 and a first complementary logic signal CX1, a second differential amplifier circuit 62 responsive to a second input signal Vin2 for producing a second logic signal X2 and a second complementary logic signal CX2, a first bipolar transistor Q61 responsive to the first logic signal X1 for changing the potential level at the emitter node N61 thereof, a second bipolar transistor Q62 responsive to the second logic signal X2 for changing the potential level at the emitter node N62 thereof, and a switching circuit 63 responsive to the first complementary logic signal CX1 and the second complementary logic signal CX2 for producing an output signal Vout.

The first and second differential amplifier circuits 61 and 62 are similar in circuit arrangement to the differential amplifier circuit 11, and the circuit components are labeled with the same references designating the corresponding components of the first embodiment.

The switching circuit 63 is implemented by a series combination of a p-channel enhancement type switching transistor Qp61 and n-channel enhancement type switching transistors Qn61 and Qn62 coupled between a common node N63 and the second negative power voltage line Vee2.

The first and second differential amplifier circuits 61 and 62 and the switching circuit 63 form in combination a logic circuit operable on the first and second input signals Vin1 and Vin2 for carrying out the OR function. In detail, if one of the first and second input signals Vin1 and Vin2 is the high level, the associated logic signal X1 or X2 also has the high level, and the associated bipolar transistor Q61 or Q62 pulls up the potential level at the common node N63. The p-channel enhancement type switching transistor Qp61 turns on, and the associated complementary logic signal CX1 or CX2 of the low voltage keeps the associated n-channel enhancement type switching transistor Qn61 or Qn62 off. As a result, the output signal Vout at an output node N64 becomes the high level. When both input signals Vin1 and Vin2 are in the high level, the output signal Vout also becomes the high level. However, if both input signals Vin1 and Vin2 are in the low level, the bipolar transistors Q61 and Q62 cause the common node N63 to go down, and the p-channel enhancement type switching transistor Qp61 turns off. The first and second complementary logic signals are changed to the high level, and both n-channel enhancement type switching transistors Qn61 and Qn62 turn off. As a result, the output signal Vout becomes the low level.

Thus, the bi-CMOS circuit implementing the sixth embodiment carries out the OR function, and achieves all of the advantages.

As will be appreciated from the foregoing description, a small number of circuit components form the bi-CMOS circuit according to the present invention. Moreover, the switching circuit is prevented from a through-current, and the current consumption is decreased.

Although particular embodiments of the present invention have been shown and described, it will be obvious to those skilled in the art that various changes and modifications may be made without departing from the spirit and scope of the present invention. For example, the bipolar circuits 11 to may form an emitter-coupled logic circuit for any logic function such as, for example, a NOR operation, a NAND operation or an exclusive-OR operation. Moreover, p-n-p type bipolar transistors are available for the bi-CMOS circuit according to the present invention.

What is claimed is:

1. A bi-CMOS circuit comprising:
   a bipolar circuit coupled between a first power voltage line and a second power voltage line, and responsive to an input signal for producing an intermediate signal and a complementary intermediate signal;

a level-shift circuit responsive to said intermediate signal and said complementary intermediate signal for producing an output signal at an output node of said bi-CMOS circuit, and comprising a first emitter follower having a collector node coupled with said first power voltage line, and responsive to said intermediate signal for changing a voltage level at the emitter node thereof, and a first switching circuit implemented by field effect transistors coupled between said emitter node of said first emitter follower and a third power voltage line, and responsive to said complementary intermediate signal for selectively coupling said output node with said emitter node and said third power voltage line; and, a second switching circuit forming in combination a logic circuit together with said bipolar circuit and said first switching circuit, said logic circuit being operable on said input signal and another input signal for carrying out a predetermined logic function.

2. The bi-CMOS circuit as set forth in claim 1, in which said second switching circuit is implemented by a first field effect transistor coupled between said output node and said third power voltage line and responsive to said another input signal for carrying out an AND operation together with said bipolar circuit.

3. The bi-CMOS circuit as set forth in claim 1, in which said second switching circuit comprises a first bipolar transistor having a collector node and a base node coupled with said first power voltage line, a first field effect transistor of a first channel conductivity type coupled between an emitter node of said first bipolar and said output node and a second field effect transistor of a second channel conductivity type opposite to said first channel conductivity type coupled between said first switching circuit and said third power voltage line, said another input signal being supplied to the gate electrode of said first field effect transistor and the gate electrode of said second field effect transistor for carrying out an OR function.

4. A bi-CMOS circuit comprising:

a bipolar circuit coupled between a first power voltage line and a second power voltage line, and responsive to an input signal for producing an intermediate signal and a complementary intermediate signal;

a level-shift circuit responsive to said intermediate signal and said complementary intermediate signal for producing an output signal at an output node of said bi-CMOS circuit, and comprising b-1) a first emitter follower having a collector node coupled with said first power voltage line, and responsive to said intermediate signal for changing a voltage level at the emitter node thereof, and b-2) a first switching circuit implemented by field effect transistors coupled between said emitter node of said first emitter follower and a third power voltage line, and responsive to said complementary intermediate signal for selectively coupling said output node with said emitter node and said third power voltage line; and another bipolar circuit coupled between said first power voltage line and said second power voltage line, and responsive to another input signal for producing another intermediate signal and another complementary intermediate signal, said level-shift circuit being further responsive to said another intermediate signal and said another complementary intermediate signal and further comprising a second emitter follower having a collector node coupled with said first power voltage line, and responsive to said another intermediate signal for changing said voltage level at a common emitter node of said first and second emitter followers, said first switching circuit being responsive to said complementary intermediate signal and said another complementary intermediate signal for selectively coupling said output node with said common emitter node and said third power voltage line.

5. The bi-CMOS circuit as set forth in claim 4, in which said first and second bipolar circuits and said first switching circuit form in combination a logic circuit operable on said first input signal and said second input signal for carrying out an OR function.

6. A bi-CMOS circuit comprising:

a) a differential amplifier circuit having a series combination of a first resistor and a first bipolar transistor coupled between a first power voltage line and a common emitter node, a series combination of a second resistor and a second bipolar transistor coupled between said first power voltage line and said common emitter node and a constant current source coupled between said common emitter node and a second power voltage line, said first bipolar transistor being responsive to an input signal changing the voltage level thereof across a reference voltage applied to the base node of said second bipolar transistor, said differential amplifier circuit thereby producing a complementary intermediate signal at a collector node of said first bipolar transistor and an intermediate signal at a collector node of said second bipolar transistor; and b) a level-shift circuit responsive to said intermediate signal and said complementary intermediate signal for producing an output signal at an output node of said bi-CMOS circuit, and having b-1) an emitter follower having a collector node coupled with said first power voltage line, and responsive to said intermediate signal for changing a voltage level at the emitter node thereof, and b-2) a first switching circuit implemented by a series combination of a first field effect transistor of one channel conductivity type and a second field effect transistor of the opposite channel conductivity type coupled between said emitter node of said emitter follower and a third power voltage line, said first field effect transistor having a gate operatively coupled with said third power voltage line, and said second field effect transistor having a gate connected directly to the collector node of said first bipolar transistor to receive said complementary intermediate signal, wherein said complementary intermediate signal has a signal amplitude greater than that of said intermediate signal.

* * * * *